United States Patent
Kerness et al.

(10) Patent No.: US 9,882,075 B2
(45) Date of Patent: Jan. 30, 2018

(54) LIGHT SENSOR WITH VERTICAL DIODE JUNCTIONS

(71) Applicant: Maxim Integrated Products, Inc., San Jose, CA (US)

(72) Inventors: Nicole D. Kerness, Menlo Park, CA (US); Christopher F. Edwards, Sunnyvale, CA (US); Khanh Tran, Milpitas, CA (US); Joy T. Jones, Fremont, CA (US); Pirooz Parvarandeh, Los Altos Hills, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/202,560

(22) Filed: Mar. 10, 2014

(65) Prior Publication Data
US 2014/0264711 A1    Sep. 18, 2014

Related U.S. Application Data (60) Provisional application No. 61/789,814, filed on Mar. 15, 2013.

(51) Int. Cl.
*H01L 31/0352* (2006.01)
*H01L 31/0232* (2014.01)
*H01L 31/103* (2006.01)

(52) U.S. Cl.
CPC .. *H01L 31/03529* (2013.01); *H01L 31/02327* (2013.01); *H01L 31/035281* (2013.01); *H01L 31/103* (2013.01); *Y02E 10/50* (2013.01)

(58) Field of Classification Search
CPC ............... H01L 31/03529; H01L 31/18; H01L 27/14643; H01L 2924/12043;
(Continued)

(56) References Cited

U.S. PATENT DOCUMENTS 3,969,746 A * 7/1976 Kendall ............ H01L 31/03529
                                                    136/255
4,140,558 A * 2/1979 Murphy et al. ............... 438/451
(Continued)

FOREIGN PATENT DOCUMENTS

JP          S5623788 A      3/1981

OTHER PUBLICATIONS

Li et al., "Multiplexed Computer-Generated Waveguide Hologram Using Grating with Different Spatial Frequencies", IEEE Photonics Tech. Let., vol. 8, No. 12, Dec. 1996, pp. 1653-1655.*
(Continued)

*Primary Examiner* — Tom Thomas
*Assistant Examiner* — Vincent Wall
(74) *Attorney, Agent, or Firm* — Advent, LLP (57) ABSTRACT

Light sensors are described that include a trench structure integrated therein. In an implementation, the light sensor includes a substrate having a dopant material of a first conductivity type and multiple trenches disposed therein. The light sensor also includes a diffusion region formed proximate to the multiple trenches. The diffusion region includes a dopant material of a second conductivity type. A depletion region is created at the interface of the dopant material of the first conductivity type and the dopant material of the second conductivity type. The depletion region is configured to attract charge carriers to the depletion region, at least substantially a majority of the charge carriers generated due to light incident upon the substrate.

14 Claims, 7 Drawing Sheets

(58) Field of Classification Search
CPC ......... H01L 2924/12038; H01L 29/861; H01L 29/868; H01L 31/103; H01L 31/035281
See application file for complete search history.

(56) References Cited

U.S. PATENT DOCUMENTS

| | | | |
|---|---|---|---|
| 4,972,244 A * | 11/1990 | Buffet | H01L 27/1446 257/442 |
| 5,047,815 A | 9/1991 | Yasuhira et al. | |
| 5,997,713 A * | 12/1999 | Beetz, Jr. | B81B 1/004 205/124 |
| 6,031,951 A * | 2/2000 | Stiens | G02B 6/124 359/576 |
| 6,144,480 A * | 11/2000 | Li | G02B 6/124 359/254 |
| 6,538,229 B1 * | 3/2003 | Bogner | B23K 1/0056 219/121.64 |
| 6,774,531 B1 * | 8/2004 | Gadeken | G21H 1/06 310/301 |
| 7,034,408 B1 | 4/2006 | Schloesser | |
| 7,250,323 B2 * | 7/2007 | Gadeken et al. | 438/56 |
| 7,732,274 B2 | 6/2010 | Zhu et al. | |
| 7,839,622 B2 | 11/2010 | Matters-Kammerer | |
| 7,902,540 B2 * | 3/2011 | Cohen | B82Y 10/00 136/251 |
| 8,085,524 B2 | 12/2011 | Roozeboom | |
| 8,835,831 B2 * | 9/2014 | Yu | H01L 27/1443 250/225 |
| 2004/0036051 A1 | 2/2004 | Sneh | |
| 2006/0051938 A1 | 3/2006 | Connell et al. | |
| 2006/0158829 A1 | 7/2006 | Kwon et al. | |
| 2006/0214230 A1 | 9/2006 | Shimokawa | |
| 2007/0058982 A1 * | 3/2007 | Onishi | B82Y 20/00 398/152 |
| 2007/0063244 A1 | 3/2007 | Ho et al. | |
| 2007/0122934 A1 * | 5/2007 | Lin | H01L 31/035281 438/69 |
| 2008/0291601 A1 | 11/2008 | Roozeboom et al. | |
| 2009/0014834 A1 | 1/2009 | Che | |
| 2009/0116029 A1 * | 5/2009 | Ohtera | G01J 3/02 356/456 |
| 2009/0159948 A1 | 6/2009 | Ho et al. | |
| 2010/0110433 A1 * | 5/2010 | Nedelcu | B82Y 20/00 356/367 |
| 2010/0117612 A1 | 5/2010 | Klootwijk | |
| 2010/0181645 A1 | 7/2010 | Marenco | |
| 2010/0316911 A1 | 12/2010 | Tesson | |
| 2011/0084360 A1 | 4/2011 | Kemerer | |
| 2011/0309240 A1 * | 12/2011 | Yu | H01L 27/1443 250/214.1 |
| 2012/0007214 A1 | 1/2012 | Chu et al. | |
| 2012/0012982 A1 | 1/2012 | Korec et al. | |
| 2012/0075513 A1 * | 3/2012 | Chipman | G01J 4/04 348/302 |
| 2012/0196424 A1 | 8/2012 | Krishnan et al. | |
| 2012/0211865 A1 | 8/2012 | Tian et al. | |
| 2013/0069198 A1 | 3/2013 | Claeys et al. | |

OTHER PUBLICATIONS

Office Action dated Oct. 10, 2016 for Chinese Appln. No. 201410151172.9.
Office Action dated Jun. 26, 2017 for Chinese Appln. No. 201410151172.9.

* cited by examiner

LIGHT SENSOR WITH VERTICAL DIODE JUNCTIONS

BACKGROUND

Electronic devices, such as smart phones, tablet computers, digital media players, and so forth, increasingly employ light sensors to control the manipulation of a variety of functions provided by the device. For example, light sensors may be used by an electronic device to detect ambient lighting conditions in order to control the brightness of the device's display screen. Typical light sensors employ photodetectors such as photodiodes, phototransistors, or the like, which convert received light into an electrical signal (e.g., a current or voltage).

SUMMARY

Light sensors are described that include a trench structure integrated therein. In an implementation, the light sensor includes a substrate having a dopant material of a first conductivity type and multiple trenches disposed therein. The light sensor also includes a diffusion region formed proximate to the multiple trenches. The diffusion region includes a dopant material of a second conductivity type. A depletion region is created at the interface of the dopant material of the first conductivity type and the dopant material of the second conductivity type. The depletion region is configured to attract charge carriers to the depletion region, at least substantially a majority of the charge carriers generated due to light incident upon the substrate.

This Summary is provided solely to introduce subject matter that is fully described in the Detailed Description and Drawings. Accordingly, the Summary should not be considered to describe essential features nor be used to determine scope of the claims.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

FIG. 1-1 is a diagrammatic partial cross-sectional view illustrating an implementation of a light sensor in accordance with an example implementation of the present disclosure, where the light sensor includes a plurality of trenches having a diffusion region formed about the trenches to cause the generation of a depletion region proximate to the trenches.

FIG. 1-2 is a diagrammatic plan view illustrating an implementation of the light sensor shown in FIG. 1-1 in accordance with another example implementation of the present disclosure, where the light sensor includes a plurality of trench regions and each trench region includes a sub-grouping of trenches.

DETAILED DESCRIPTION

Overview

Increasingly, gesture detection is being employed by electronic devices to detect user input for various applications associated with the electronic device. Such electronic devices typically have light sensor configurations employing a number of photodetectors to improve range and operation (e.g., noise reduction) of gesture detection. These sensor configurations may also provide limited tracking and detection of complicated gestures (e.g., in-and-out gestures, diagonal swipe gestures, and so forth). Additionally, these electronic devices employ illumination sources, such as IR light sources to emit light. The emitted light may be reflected by an object in proximity of the electronic device, and the reflected light is detected by the photodetectors.

Light sensors are described that include a trench structure integrated therein. In an implementation, the light sensor includes a substrate having a dopant material of a first conductivity type and multiple trenches disposed therein. For example, the substrate may comprise a P−− doped substrate. In some implementations, a first sub-group of trenches may be at least substantially adjacent to a second sub-group of trenches. The light sensor also includes a diffusion region formed proximate to the multiple trenches. The diffusion region includes a dopant material of a second conductivity type. For example, the diffusion region may comprise an N+ doped diffusion region. A depletion region is created at the interface of the dopant material of the first conductivity type and the dopant material of the second conductivity type. The depletion region is configured to attract charge carriers to the depletion region, at least substantially a majority of the charge carriers generated due to light incident upon the substrate. By employing a plurality of trenches, the density of depletion regions may be improved. Additionally, by incorporating depletion regions about the trenches, a light, such as an infrared light, that generates charge carriers deeper (e.g., generate carriers deeper than two micrometers (2 μm or greater) within the substrate may be detected utilizing the deeper trench regions.

Example Light Sensor

Figure 11:
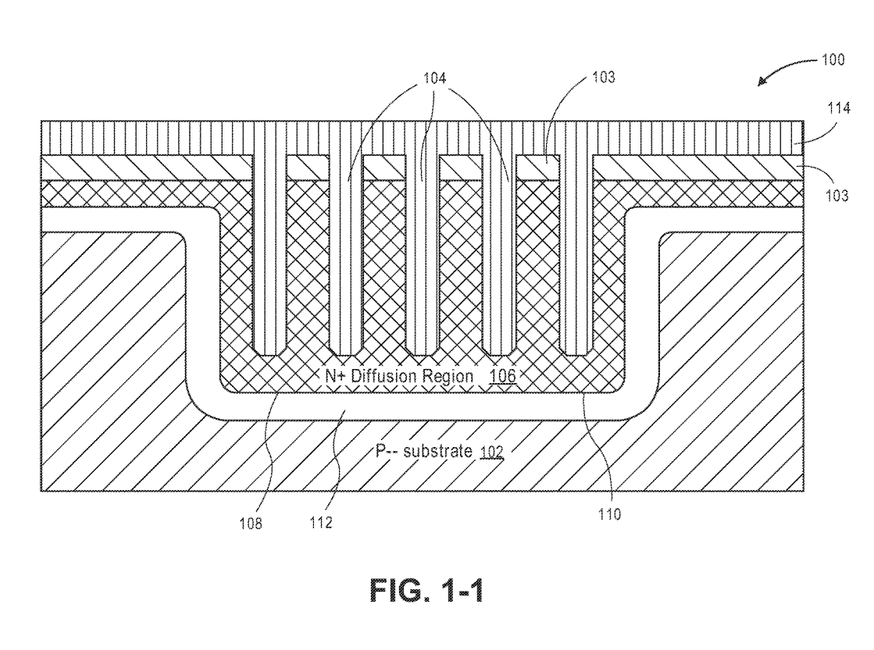
Figure 12:
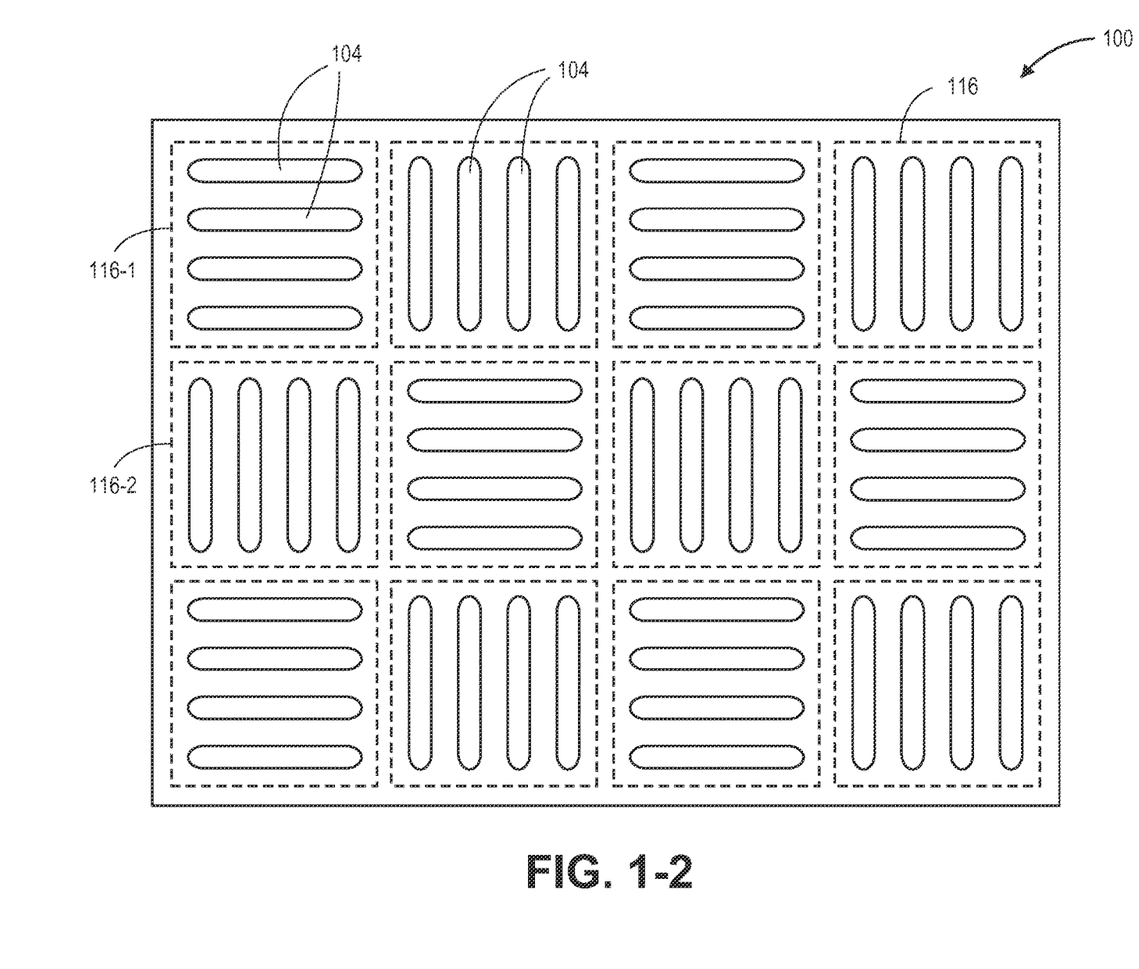

FIGS. 1-1 and 1-2 illustrates an example light sensor 100 (e.g., photodetector) in accordance with example implementations of the present disclosure. As shown, the light sensor 100 includes a substrate 102. The substrate 102 comprises a base material utilized to form one or more integrated circuit devices through various semiconductor fabrication techniques, such as photolithography, ion implantation, deposition, etching, and so forth. In one or more implementations, the substrate 102 comprises a portion of a silicon wafer that may be configured in a variety of ways. For example, the substrate 102 may comprise a portion of an n-type silicon wafer or a portion of a p-type silicon wafer. In an implementation, the substrate 102 may comprise group V elements (e.g., phosphorus, arsenic, antimony, etc.) configured to furnish n-type charge carrier elements. In another implementation, the substrate 102 may comprise group MA elements (e.g., boron, etc.) configured to furnish p-type charge carrier elements. In a specific implementation, the substrate 102 comprises a P−− region. However, it is contemplated that other conductive types may be utilized, such as a P− region, a P region, or the like.

As shown, a hardmask layer 103 is disposed over the surface of the substrate 102. The substrate 102 includes a plurality of trenches 104 formed therein. For example, as described in greater detail below, the hardmask layer 103 is patterned and etched during formation of the trenches 104. In embodiments, the trenches 104 may be elongated trenches. The trenches 104 have a depth of about twenty micrometers (20 µm) or greater. For example, the depths of the trenches 104 range from about twenty micrometers (20 µm) to about forty micrometers (40 µm). In a specific implementation, the width of each trench 104 may be approximately five hundred nanometers (500 nm) or less, and the depth of each trench 104 may be about thirty micrometers (30 µm). The pitch of the trenches 104 may be about eight hundred nanometers (800 nm), or less in some configurations. The length of the trenches may be two micrometers (2 um) to twenty micrometers (20 um). In one or more implementations, the trenches 104 may have an aspect ratio of about fifty to one (50:1) to about one hundred and fifty to one (150:1).

The trenches 104 allow a subsequent N+ diffusion region 106 (e.g., portion of the substrate 102 that encompasses the trenches 104 is comprised of the N+ diffusion region 106) to form proximate (e.g., about, or surrounding the) trenches 104. The N+ diffusion region 106 is disposed within the P−− region of the substrate 102 (see FIG. 1). In a specific implementation, the P−− region of the substrate 102 may be doped $1 \times 10^{19}$ atoms per square centimeter to allow for a larger depletion region (e.g., as compared to a depletion region created by a P− or a P region). The N+ diffusion region 106 may be doped at greater than $1 \times 10^{19}$ atoms per square centimeter to achieve a suitable doping profile in high aspect ratio trenches. Thus, a p-n junction 108 is created at the interface 110 of the region 102 and the region 106. The p-n junction 108 serves to cause generation of a depletion region 112 proximate to the trenches 104. In a specific implementation, the depletion region 112 is an elongated depletion region 112. Additionally, the depletion region 112 may extend beyond the depth of the trenches 104. The depletion region 112 causes generation of an electric field due to exchange of charge carriers between the P−− region 102 and the N+ diffusion region 106 (which in turn leaves charged ions within each respective region 102, 106 and causes the generation of the electric field). As described in greater detail herein, the depletion region 112 is utilized to absorb (e.g., capture) electron-hole pairs created by the light incident upon the substrate 102.

The depth of the trenches 104 allow for absorption of light occurring in the infrared light spectrum. For example, light occurring at approximately nine hundred and fifty nanometers (e.g., light having a wavelength value at approximately nine hundred and fifty nanometers) penetrates further into the substrate 102 as compared to light occurring lower than nine hundred and fifty (e.g., light penetrates further into the substrate 102 before causing generation of an electron-hole pair). Thus, electron-hole pairs are generated by the light occurring at the nine hundred and fifty nanometer value deeper (e.g., further) in the substrate 102 as compared to electron-hole pairs generated by light occurring at values less than nine hundred and fifty nanometers (e.g., light occurring within the visible spectrum causes generation of electron-hole pairs within the substrate 102 at a shallower depth as compared to light occurring with the infrared spectrum). Due to the extended depth of the trenches 104, the depletion region 112 formed about the trenches 104 may absorb, or capture, electrons generated due to light occurring within the infrared spectrum. Thus, during operation of the light sensor 100, the electric field generated due to the presence of the depletion region 112 attracts the generated charge carriers to the depletion region 112, which may increase the amount of charge carriers within the depletion region 112 (and causes an increase in current).

As shown, the trenches 104 may include one or more layers 114. The layers 114 may comprise a variety of materials. In an implementation, the layers 114 may comprise an optically transparent layer (e.g., a layer that is configured to be transparent to light occurring within wavelengths of interest). For example, the optically transparent layer 114 may comprise an n-doped polysilicon layer that provides an electrical connection (e.g., a pin). In another implementation, the layer 114 may comprise an insulation layer(s). For example, the insulation layers may comprise a silicon dioxide ($SiO_2$) layer.

As shown in FIG. 1-2, the light sensor 100 includes a plurality of trench regions 116. Each trench region 116 (e.g., a sub-grouping of trenches 104) includes a plurality of trenches 104 formed within the substrate 102. As shown, the trenches 104 of a respective trench region 116 are at least substantially parallel with respect to one another within that trench region 116. For example, the substrate 102 includes a first trench region 116-1 and a second trench region 116-2. The trenches 104 of the first trench region 116-1 are at least substantially parallel with the other trenches 104 of the first trench region 116-1, and the trenches 104 formed within the second trench region 116-2 are at least substantially parallel with the other trenches 104 of the second trench region 116-2.

The trenches 104 of a trench region 116 are at least substantially perpendicular with respect to the trenches 104 of the adjacent trench regions 116. For example, the trenches 104 of the first trench region 116-1 are at least substantially perpendicular with the trenches 104 of the second trench region 116-2. Thus, the trenches 104 of each respective trench region 116 is at least substantially perpendicular with the trenches 104 of the adjacent trench regions 116 (i.e., adjacent in the x- and y-directions). For example, as shown in FIG. 1-2, the light sensor 100 includes alternating perpendicular trench regions 116. The perpendicular orientation of the trenches 104 within adjacent trench regions 116 may provide for facilitating stress management and for detecting gestures (e.g., detecting light) from at least approximately ninety-degrees (90°) with respect to the surface of the light sensor 100. In some instances, the perpendicular orientation may reduce wafer bow and wafer warpage. Thus, a greater percentage of the substrate 102 may be utilized for other integrated components, such as integrated circuit devices, capacitors, and so forth. Additionally, the orientation of the trench regions 116 may increase the sensitivity of the light sensor 100 as compared to a light sensor having trenches oriented parallel to one another. For example, the orientation of the first trench region 116-1 may detect a greater amount of light incident upon the light sensor 100 from a first direction than the second trench region 116-2 detects. In another example, the orientation of the second trench region 116-2 may detect a greater amount of light incident upon the light sensor 100 from a second direction (e.g., a direction different than the first direction) than the first trench region 116-1 detects.

Example Fabrication Processes

Figure 2:
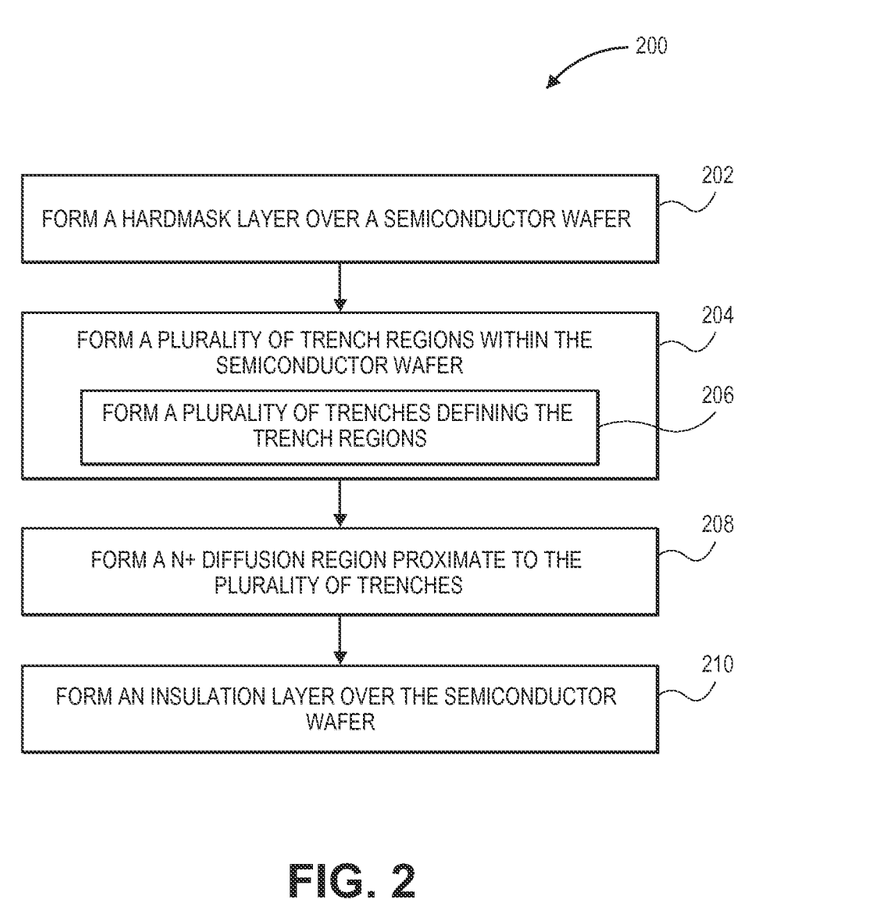
FIG. 2 is a flow diagram illustrating a process in an example implementation for fabricating light sensors having a trench formed therein, such as the sensors shown in FIGS. 1-1 and 1-2.
Figure 3:
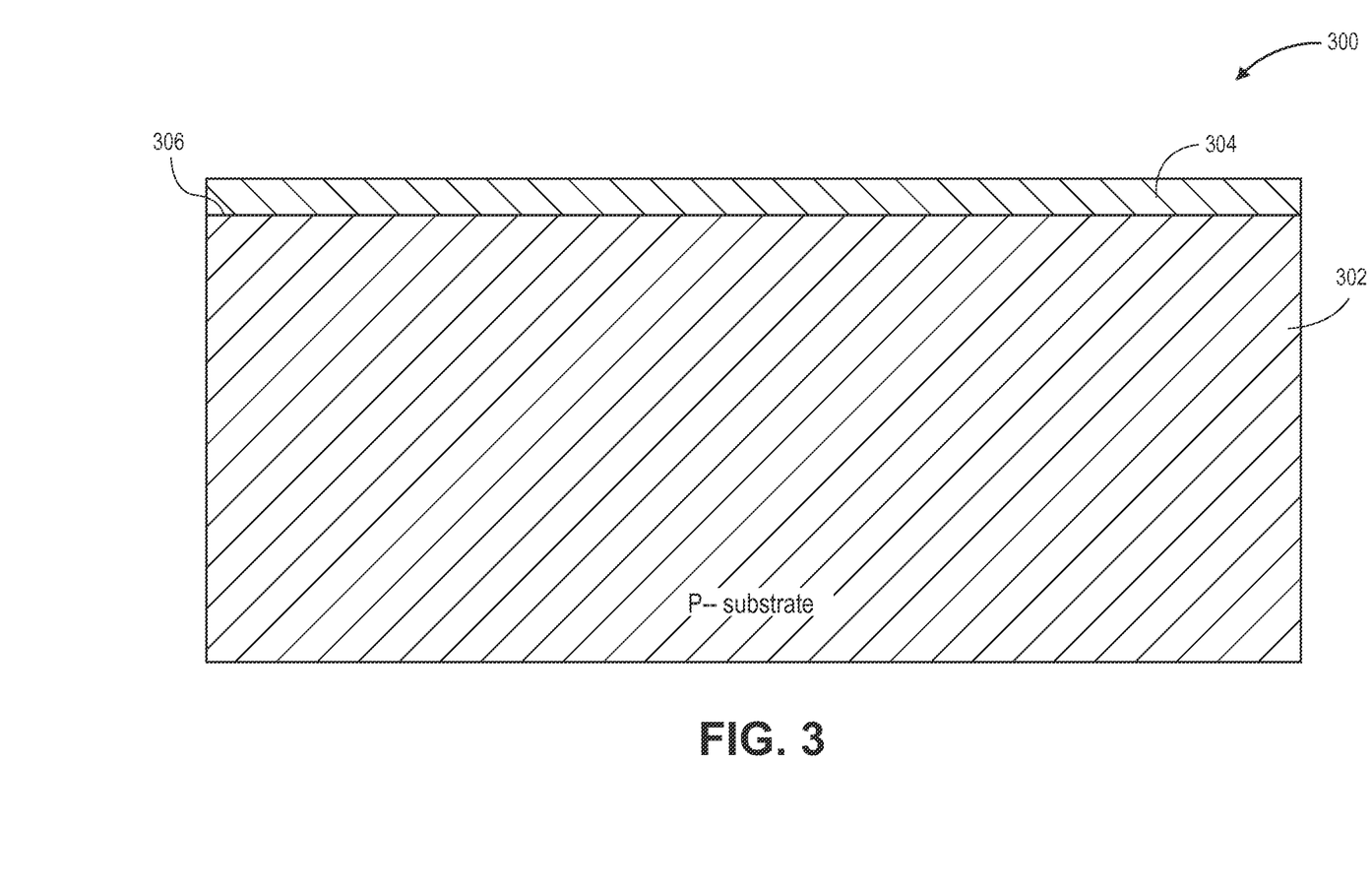
FIGS. 3 through 6 are diagrammatic partial cross-sectional views illustrating the fabrication of a light sensor, such as the light sensor shown in FIGS. 1-1 and 1-2, in accordance with the process shown in FIG. 2.

FIG. 2 illustrates an example process 200 that employs semiconductor fabrication techniques to fabricate light sensors having a trench structures integrated therein, such as the light sensor 100 shown in FIGS. 1-1 through 1-2. FIGS. 3 through 6 illustrate formation of example light sensors 500 in an example semiconductor wafer 302. As illustrated in FIG. 2, a hardmask layer is formed over a semiconductor wafer (Block 202). In an implementation, as shown in FIG. 3, the wafer 302 includes a dopant material of a first conductivity type. For example, the wafer 302 is a P−− semiconductor wafer (e.g., the wafer is doped P−−). A hardmask layer 304 is formed (e.g., deposited) over a surface 306 of the wafer 302. In an implementation, the thickness of the hardmask layer 304 may range from about two micrometers (2 μm) to about six micrometers (6 μm). The hardmask layer 304 may be an oxide layer, or the like.

Figure 4:
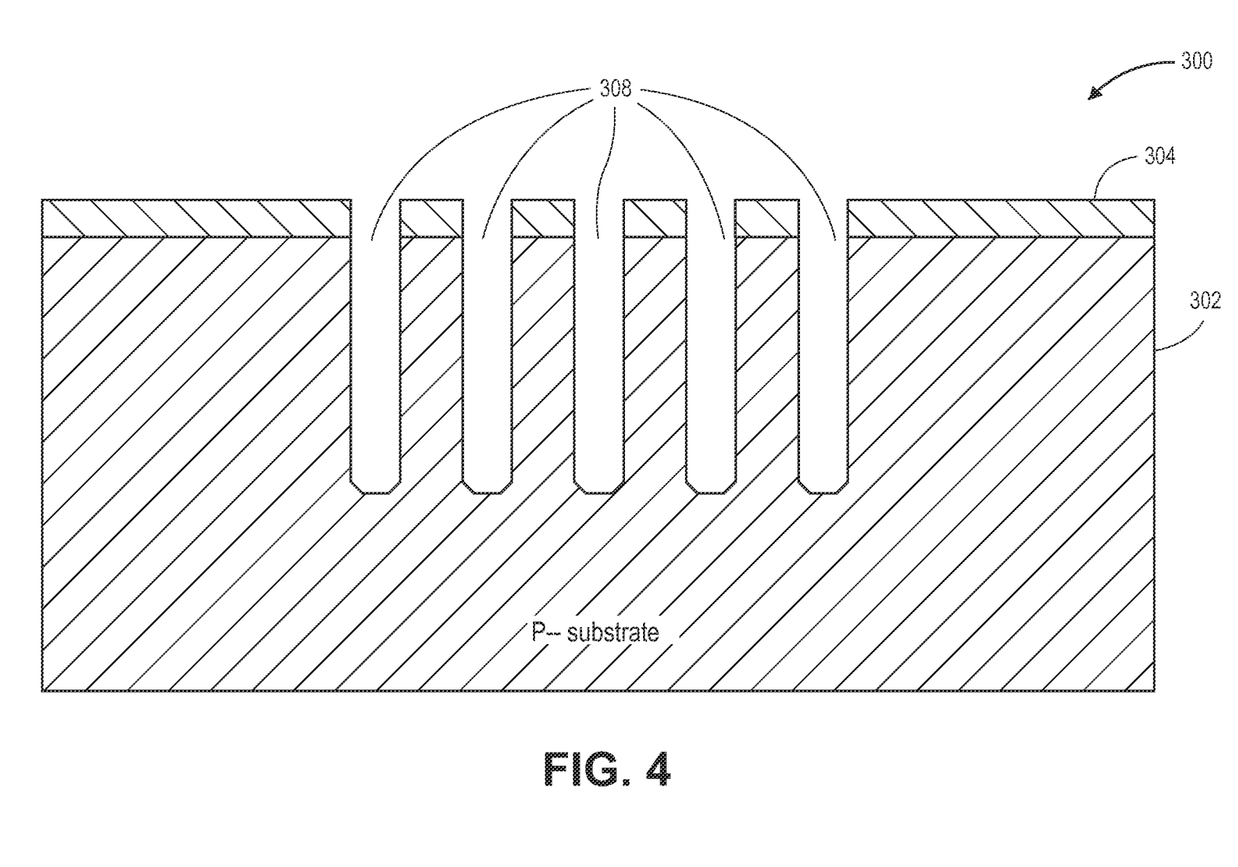

A plurality of trench regions are formed in the semiconductor wafer (Block 204). More specifically, a plurality of trenches are formed that define the trench regions (Block 206). As described above with respect to FIGS. 1-1 and 1-2, multiple trench regions (e.g., trench regions 116 shown in FIG. 1-2) are formed within the semiconductor wafer 302 by way of forming at least one trench 308 within the trench regions. Thus, multiple trenches 308 are formed within the semiconductor wafer to form and/or define the trench regions. Suitable i-line or deep ultraviolet (DUV) lithography techniques may be utilized to form the plurality of trenches 308 (see FIG. 4). For example, the hardmask layer 304 may be patterned (e.g., depositing photoresist over the hardmask layer and patterning the photoresist) and etched (e.g., a deep reactive-ion etching technique) to form the trenches 308. The thickness of the hardmask layer 304 assists in facilitating formation of trenches 308 having a depth ranging from about (20 μm) to about forty micrometers (40 μm). In a specific implementation, a suitable Bosch etching technique may be utilized to etch the wafer 302 to form the trenches 308. As described above, the trenches 308 of a respective capacitor region (e.g., sub-grouping of trenches 308) are at least substantially perpendicular to the trenches 308 of the adjacent capacitor region.

Figure 5:
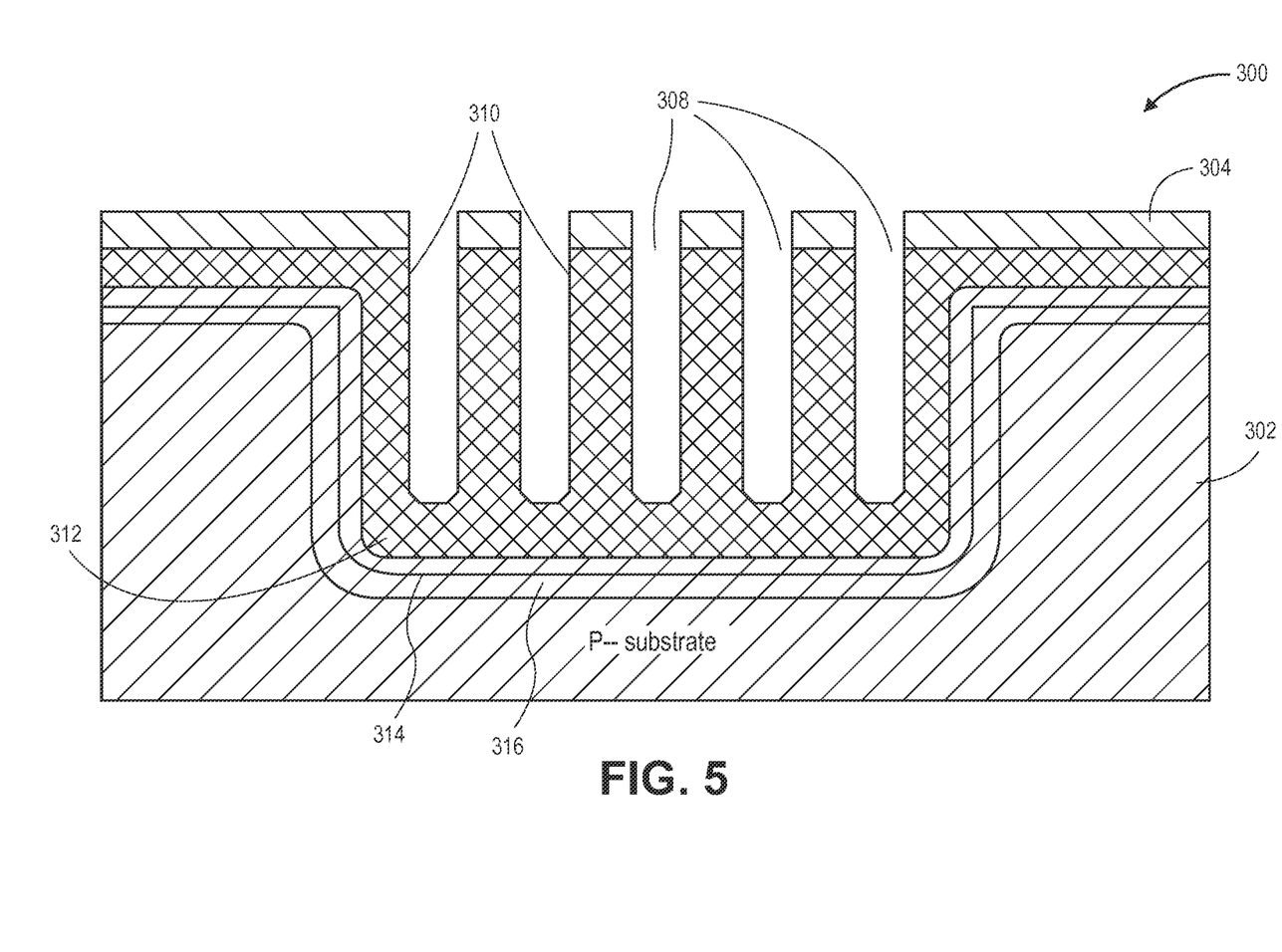

Once the trench regions and the trenches are formed, an N+ diffusion region is formed proximate to the trenches (Block 208) such that the trenches are at least substantially encapsulated by the N+ diffusion region. As shown in FIG. 5, the trench sidewalls 310 are subjected to a diffusion deposition to form a diffusion region 312 having dopant material of a second conductivity type. For example, the diffusion region 312 is an N+ diffusion region 312 proximate (e.g., adjacent) to the trenches 308. In an implementation, the N+ diffusion deposition is performed prior to the hardmask layer 304 being removed to allow the N+ diffusion region 312 to self-align with respect to the trenches 308. The N+ diffusion region 312 may also provide capacitor-to-capacitor bulk isolation. In an implementation, the N+ diffusion doping concentration is greater than $1 \times 10^{19}$ atoms per square centimeter. The formation of the N+ diffusion region 312 serves to create the p-n junction 314 within the wafer 302. The p-n junction 314 causes the generation of a depletion region 316, which extends at least substantially the depth of the trenches 308. In some implementations, the depletion region 316 extends beyond the depth of the trenches 308. Additionally, in an implementation, a phosphoryl chloride ($POCl_3$) doping step may be performed at less than nine hundred degrees Celsius (<900° C.), which may slow the reaction kinetics so that the sidewall and the bottom of the trenches 308 are at least substantially uniformly doped. For example, the doping process temperature may range from at least approximately eight hundred and seventy-five degrees Celsius (875° C.) to at least approximately eight hundred and ninety-five degrees Celcius (895° C.). In another example, the doping process temperature may range from at least approximately eight hundred and eighty degrees Celsius (880° C.) to at least approximately eight hundred and ninety degrees Celsius (890° C.).

Figure 6:
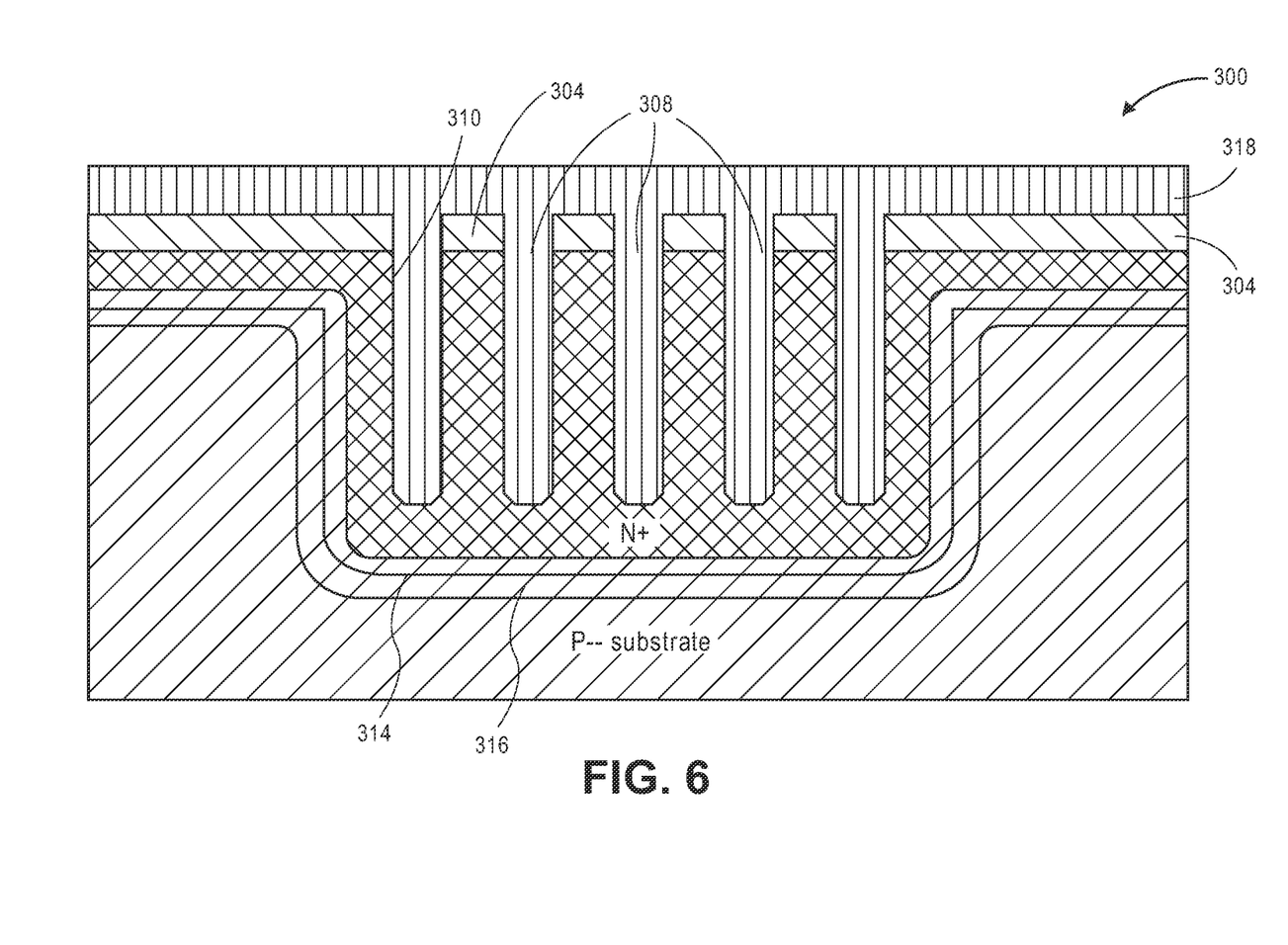

An insulation layer is formed over the semiconductor wafer (Block 210). As shown in FIG. 6, a layer 318 is formed over the surface 306 of the wafer 302. The layer 318 may be a doped polysilion layer for furnishing an electrical contact, an insulation layer (e.g., a silicon dioxide ($SiO_2$) layer), or the like.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A light sensor comprising:
a substrate having dopant material of a first conductivity type;
a diffusion region comprising a plurality of first diffusion regions and second diffusion regions in the substrate, the diffusion region having dopant material of a second conductivity type, the first diffusion regions having a first thickness and the second diffusion regions having a second thickness, the first thickness greater than the second thickness, the second diffusion regions connecting the first diffusion regions with one another;
a plurality of first groups of trenches, wherein each first group of trenches comprises a plurality of trenches disposed within the diffusion region, each trench of the first groups of trenches extending entirely along a first axis as defined parallel to a surface of the substrate;
a plurality of second groups of trenches, wherein each second group of trenches comprises a plurality of trenches disposed within the diffusion region, each trench of the second groups of trenches extending entirely along a second axis as defined parallel to a surface of the substrate, the second axis perpendicular to the first axis, the second group of trenches adjacent to the first group of trenches;
wherein each first diffusion region entirely occupies all portions of the substrate that extend between respective trenches belonging to a respective group of trenches, wherein a p-n junction is formed between the dopant material of the first conductivity type and the dopant material of the second conductivity type, wherein the diffusion region is configured to cause generation of a depletion region proximate to the p-n junction, wherein the depletion region around the first diffusion region extends beyond a depth and length of the respective group of trenches and generates an electric field to absorb electron-hole pairs generated by light occurring within an infrared spectrum,
wherein the plurality of second groups of trenches do not intersect with the plurality of first groups of trenches.

2. The light sensor as recited in claim 1, wherein the plurality of trenches have an aspect ratio ranging from about fifty to one (50:1) to about one hundred and fifty to one (150:1).

3. The light sensor as recited in claim 1, wherein the depth of the plurality of trenches is at least approximately twenty micrometers (20 um).

4. The light sensor as recited in claim 1, wherein a pitch between a first trench of the plurality of trenches and a second trench of the plurality of trenches is eight hundred nanometers.

5. The light sensor as recited in claim 1, wherein dopant material of the first conductivity type comprises a P-- material and the dopant material of the second conductivity type comprises an N+ material.

6. The light sensor as recited in claim 1, wherein the trench orientation of the plurality of first groups of trenches and the plurality of second groups of trenches facilitate stress management of the substrate.

7. The light sensor as recited in claim 1, wherein the plurality of first groups of trenches and the plurality of second groups of trenches alternate trench orientation such that respective trenches of the plurality of first groups of trenches extend entirely along the first axis as defined parallel to the surface of the substrate and respective trenches of the plurality of second groups of trenches extend entirely along the second axis as defined parallel to the surface of the substrate.

8. A light sensor comprising:
a substrate comprising a P-- dopant material;
a diffusion region comprising a plurality of first diffusion regions and second diffusion regions in the substrate, the diffusion comprising an N+ dopant material, the first diffusion regions having a first thickness and the second diffusion regions having a second thickness, the first thickness greater than the second thickness, the second diffusion regions connecting the first diffusion regions with one another;
a plurality of first groups of trenches, wherein each first group of trenches comprises at least four trenches disposed within the diffusion region, each trench of the first groups of trenches extending entirely along a first axis as defined parallel to a surface of the substrate;
a plurality of second groups of trenches wherein each second group of trenches comprises at least four trenches disposed within the diffusion region, each trench of the second group of trenches extending entirely along a second axis as defined parallel to a surface of the substrate, the second axis perpendicular to the first axis, the second groups of trenches adjacent to the first groups of trenches;
wherein each first diffusion region entirely occupies all portions of the substrate that extend between respective trenches belonging to a respective group of trenches, wherein a p-n junction is formed between the N+ dopant material and the P-- dopant material, wherein the diffusion region is configured to cause generation of a depletion region proximate to the p-n junction, wherein the depletion region around the first diffusion region extends beyond a depth and length of the respective group of trenches and generates an electric field to absorb electron-hole pairs generated by light occurring within an infrared spectrum,
wherein the plurality of second groups of trenches do not intersect with the plurality of first groups of trenches.

9. The light sensor as recited in claim 8, wherein at least four trenches have an aspect ratio ranging from about fifty to one (50:1) to about one hundred and fifty to one (150:1).

10. The light sensor as recited in claim 8, wherein the depth of the at least four trenches is at least approximately twenty micrometers (20 µm).

11. The light sensor as recited in claim 8, wherein a pitch between a first trench of the at least four trenches and a second trench of the at least four trenches is eight hundred nanometers.

12. The light sensor as recited in claim 8, wherein the depth of the at least four trenches ranges from at least approximately twenty micrometers (20 µm) to at least approximately forty micrometers (40 µm).

13. The light sensor as recited in claim 8, wherein the trench orientation of the plurality of first groups of trenches and the plurality of second groups of trenches facilitate stress management of the substrate.

14. The light sensor as recited in claim 8, wherein the plurality of first groups of trenches and the plurality of second groups of trenches alternate trench orientation such that respective trenches of the plurality of first groups of trenches extend entirely along the first axis as defined parallel to the surface of the substrate and the plurality of second groups of trenches extend entirely along the second axis as defined parallel to the surface of the substrate.

* * * * *